(12) United States Patent
Kuang et al.

(10) Patent No.: US 11,658,253 B2
(45) Date of Patent: May 23, 2023

(54) HIGH ABSORPTION PHOTOVOLTAIC MATERIAL AND METHODS OF MAKING THE SAME

(71) Applicant: RENSSELAER POLYTECHNIC INSTITUTE, Troy, NY (US)

(72) Inventors: Ping Kuang, Latham, NY (US); Shawn Yu Lin, Troy, NY (US); Anthony Post, Catskill, NY (US); Sajeev Oommen John, Mississauga (CA); Sergey Leonidovich Eyderman, Toronto (CA); Mei-Li Hsieh, Zhunan Township (TW)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 16/951,541

(22) Filed: Nov. 18, 2020

(65) Prior Publication Data
US 2021/0074867 A1    Mar. 11, 2021

Related U.S. Application Data

(63) Continuation of application No. 16/099,081, filed as application No. PCT/US2017/031556 on May 8, 2017, now abandoned.
(Continued)

(51) Int. Cl.
*H01L 31/0236* (2006.01)
*H01L 31/0216* (2014.01)
*H01L 31/18* (2006.01)

(52) U.S. Cl.
CPC .. *H01L 31/02363* (2013.01); *H01L 31/02168* (2013.01); *H01L 31/18* (2013.01); *Y02E 10/52* (2013.01)

(58) Field of Classification Search
None
See application file for complete search history.

(56) References Cited

U.S. PATENT DOCUMENTS

| 7,196,262 B2 | 3/2007 | Gronet |
| 8,937,763 B2 * | 1/2015 | Ding ................. H01S 3/08059 |
| | | 359/344 |

(Continued)

FOREIGN PATENT DOCUMENTS

| CN | 204928739 | 12/2015 |
| CN | 111244208 | 2/2022 |

(Continued)

OTHER PUBLICATIONS

Qing Guo Du, Chan Hin Kam, Hilmi Volkan Demir, Hong Yu Yu, and Xiao Wei Sun, "Enhanced optical absorption in nanopatterned silicon thin films with a nano-cone-hole structure for photovoltaic applications," Opt. Lett., vol. 36, pp. 1713-1715 (Year: 2011).*

(Continued)

*Primary Examiner* — Omar R Rojas
(74) *Attorney, Agent, or Firm* — Murtha Cullina LLP; Anthony P. Gangemi

(57) ABSTRACT

A high absorption photovoltaic material and method of making the material for use in a solar cell are disclosed. The photovoltaic material includes a surface modified with a layer of repeating photonic crystal structures. The photonic crystal structures are approximately inverse conically shaped and have a curved sidewall that has an approximately Gaussian shape. The photonic crystal structures generally have a high vertical depth and sidewall angle. The structures also have a gradient refractive index profile and exhibit the parallel-to-interface refraction light trapping effect. An anti-reflective coating is disposed over the photonic crystal structure layer. The photovoltaic material exhibits near unity light absorption over a broad range of visible and near (Continued)

infrared wavelengths and incidence angles, even at reduced thicknesses. The photovoltaic structures are formed via a combined photolithography and reactive-ion etching method at low power with a gas mixture having a high ratio of an etchant component to a passivation component.

11 Claims, 4 Drawing Sheets

Related U.S. Application Data

(60) Provisional application No. 62/332,531, filed on May 6, 2016.

(56) References Cited

U.S. PATENT DOCUMENTS

| 2007/0235072 | A1 | 10/2007 | Bermel et al. |
| 2009/0022464 | A1 | 1/2009 | Hamada |
| 2009/0110591 | A1 | 4/2009 | Guerra |
| 2011/0220175 | A1 | 9/2011 | Haney et al. |
| 2015/0107665 | A1 | 4/2015 | Raymond et al. |

FOREIGN PATENT DOCUMENTS

| KR | 101319674 | 10/2013 |
| KR | 20100021539 | 6/2014 |
| KR | 20100021540 | 10/2015 |
| WO | 2010065635 A2 | 6/2010 |

OTHER PUBLICATIONS

Minfeng Chen, Hung-chun Chang, Allan S. P. Chang, Shawn-Yu Lin, J.-Q. Xi, and E. F. Schubert, "Design of optical path for wide-angle gradient-index antireflection coatings," Appl. Opt. 46, 6533-6538 (2007).*

International Search Report and The Written Opinion of the International Searching Authority, International Application No. PCT/US2017/031556, dated Aug. 24, 2017.

International Preliminary Report on Patentability, International Application No. PCT/US2017/031556, date of completion of report May 29, 2018.

"Solar Cell Efficiency World Record Set By Sharp—44.4%" Jun. 23, 2013, https://cleantechnica.com/2013/06/23/solar-cell-efficiency-world-record-set-by-sharp-44-4/.

Shockley, W. & Queisser, H. J. Detailed balance limit of efficiency of p-n junction solar cells. J. Appl. Phys. 32, 510 (1961).

Tiedje, T., Yablonovitch, E., Cody, G. & Brooks, B. Limiting efficiency of silicon solar cells. IEEE Trans. Electron Devices 31,711 (1984).

Richter, A., Hermle, M. & Glunz, S. W. Reassessment of the limiting efficiency for crystalline silicon solar cells. IEEE J. Photovolt. 3, 1184 (2013).

Richter, A., Glunz, S. W., Werner, F., Schmidt, J. & Cuevas, A. Improved quantitative description of Auger recombination in crystalline silicon. Phys. Rev. B 86, 165202 (2012).

Chen, M.; Chang, H.-C.; Chang, A. S.P.; Lin, S.-Y.; Xi, J-Q.; Schubert. E. F. Design of Optical Path for Wide-Angle Gradient-Index Antireflection Coatings. Appl. Opt. 2007, 46, 6533-6538.

* cited by examiner

HIGH ABSORPTION PHOTOVOLTAIC MATERIAL AND METHODS OF MAKING THE SAME

CROSS REFERENCE TO RELATED APPLICATION(S)

This application is a continuation of U.S. Utility patent application Ser. No. 16/099,081, filed Nov. 5, 2018, which is a national stage filing of International Patent Application No. PCT/US2017/031556, filed May 8, 2017, which claims the benefit of U.S. Provisional Application No. 62/332,531, filed May 6, 2016, which is incorporated by reference as if disclosed herein in its entirety.

STATEMENT REGARDING FEDERALLY SPONSORED RESEARCH OR DEVELOPMENT

This invention was made with government support under grant no. DE-FG02-06ER46347 awarded by the Department of Energy. The government has certain rights in the invention.

BACKGROUND

The development and utilization of solar power and solar cells have steadily increased in recent years in an effort to create a sustainable, renewable, and clean energy resource. As a result, the market for photovoltaic materials for use in these solar cells is one of the fastest growing markets globally and in the United States.

Traditional silicon-based photovoltaic materials are multi-layer constructions that struggle with high dollar-per-Watt cost due to the amount of material required to produce them. To save on cost, the thickness of these materials is reduced, often from the order of hundreds of micrometers to tens of micrometers. However, these thinner photovoltaic materials suffer large decreases in efficiency due to insufficient light absorption. This disadvantageous decrease in light absorption is particularly evident in the longer, near-infrared wavelength range of the solar spectrum.

SUMMARY

Some embodiments of the disclosed subject matter are directed to a photovoltaic material having a surface modified with a layer of repeating photonic crystal structures. The photonic crystal structures are approximately inverse conically shaped and have simple cubic geometry. The photonic crystal structures have a curved sidewall that has an approximately Gaussian shape and a gradient refractive index profile. In some embodiments, an anti-reflective coating is disposed over the photonic crystal structure layer. The photonic crystal structures exhibit a light trapping effect known as parallel-to-interface refraction. This effect, combined with the gradient refractive index profile and the anti-reflective coating combine to produce a photovoltaic material with near-unity absorption of light at visible wavelengths and vastly improved absorption at longer, near-infrared wavelengths, even on thinner photovoltaic material wafers.

In some embodiments, the photonic crystal structures are made using a combination photolithography and reactive-ion etching process. A 2-D photoresist hole array is deposited on the surface of the photovoltaic material. The photovoltaic material surface left exposed is then subjected to low power reactive-ion etching with a gas mixture having a high concentration of an etchant component to a passivation component. The result is a more isotropic etch while the sidewalls remain relatively smooth to prevent undesired light reflection.

BRIEF DESCRIPTION OF THE DRAWINGS

The drawings show embodiments of the disclosed subject matter for the purpose of illustrating the invention. However, it should be understood that the present application is not limited to the precise arrangements and instrumentalities shown in the drawings, wherein.

DETAILED DESCRIPTION

Figure 1A:
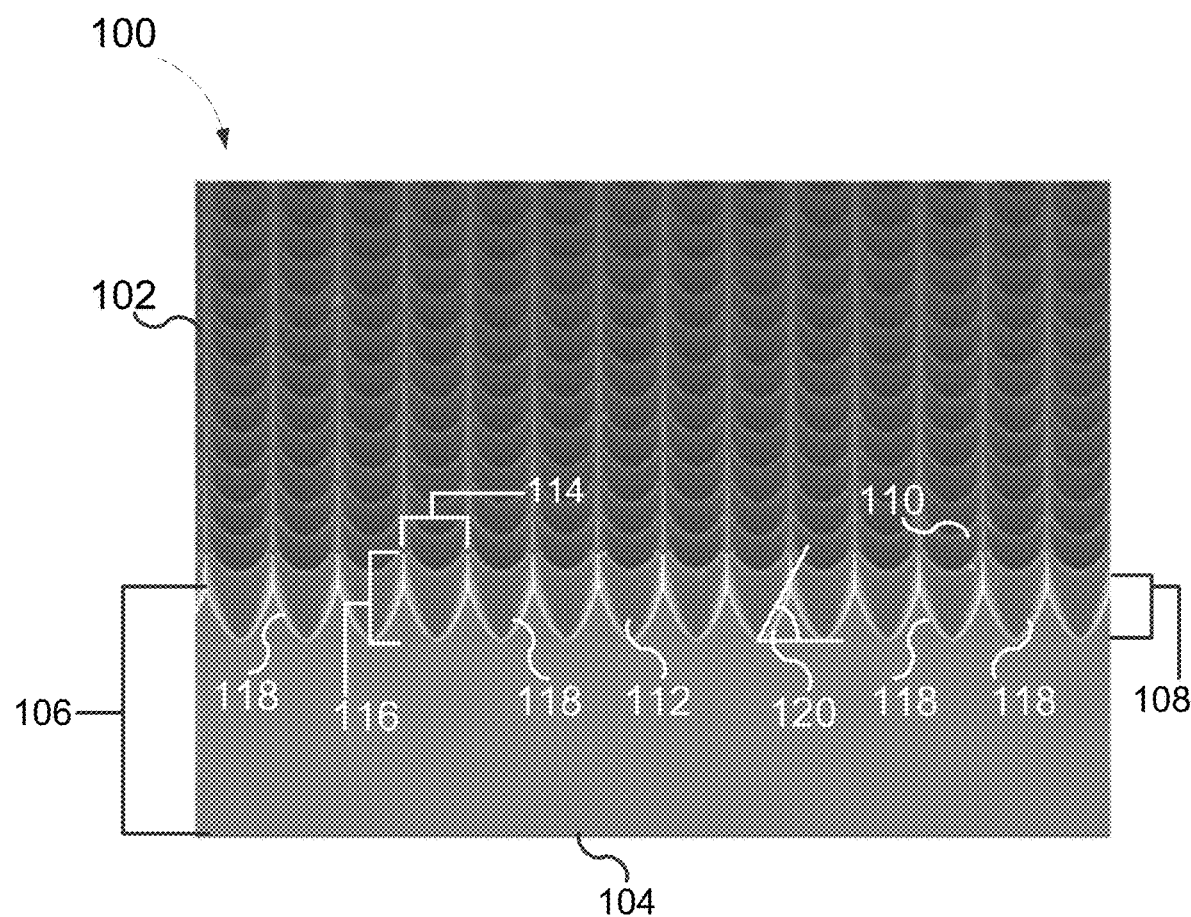
FIG. 1A is a front isometric scanning electron microscope image of a high absorption photovoltaic material according to some embodiments of the present disclosure.

Referring now to FIG. 1A, aspects of the disclosed subject matter include a high absorption photovoltaic material 100 having a photovoltaic material surface 102 and an opposite second surface 104. In some embodiments, photovoltaic material 100 is composed of inorganic materials such as crystalline silicon, multi-crystalline silicon, amorphous silicon, GaAs, CIGS, CdTe, perovskite, etc., organic photovoltaic materials, other suitable photovoltaic materials, or a combination thereof. In some embodiments, photovoltaic material 100 has a thickness 106 less than about 100 µm, e.g., about 50 µm, 20 µm, 10 µm, or less. In some embodiments, photovoltaic material 100 is a thin layer photovoltaic material, e.g., a silicon-on-insulator wafer or other thin film photovoltaic material, such as fabricated by chemical vapor deposition or physical vapor deposition technique processes.

Photovoltaic material 100 as described above includes a photonic crystal structure layer 108 that defines photonic material surface 102. In some embodiments, photovoltaic material 100 includes an anti-reflective coating 110 on photonic crystal structure layer 108. In some embodiments, anti-reflective coating 110 is $SiO_2$, ZnO, $AlO_3$, $Si_3N_4$, or a combination thereof. In some embodiments, anti-reflective coating 110 is only a single layer. In some embodiments, anti-reflective coating 110 has a thickness less than about 1 µm. In some embodiments, anti-reflective coating 110 has a thickness of about 0.03 µm to about 0.12 µm. In some embodiments, anti-reflective coating 110 has a thickness less than about 0.1 µm.

Photonic crystal structure layer 108 includes photonic crystal structures 112 having an approximately inverse conical shape. As used herein, the terms "approximately" and "about" are used to indicate that insubstantial changes to the limitation are also envisioned. For example, the term "approximately inverse conical shape" is used to convey that the shape of photonic crystal structures 112 resembles a generally conical shape. However, insubstantial deviations from the inverse conical shape, which have little to no impact on the absorptive properties and performance of the present disclosure discussed herein, are also envisioned. In some embodiments, photonic crystal structures 112 have a substantially simple cubic symmetry. In some embodiments, photonic crystal structures 112 repeat across substantially all of photovoltaic material surface 102. In some embodiments, photonic crystal structures 112 are present on only a portion of photovoltaic material surface 102. In some embodiments, photonic crystal structures 112 have a width 114 and a depth 116 where the relative sizes of the width and depth are defined according to a value of Equation 1:

$$(d)/(a/2), \quad (1)$$

where (a) is width 114 and (d) is depth 116.

In some embodiments, the value of $(d)/(a/2)$ for photonic crystal structures 112 is greater than 2. In the example portrayed in FIG. 1, $(d)/(a/2)$ is about 2.3.

Photonic crystal structures 112 thus typically, but not always, have a relatively large vertical depth, for example compared to a typical KOH-etched inverted pyramid structure profile having a $(d)/(a/2)$ value of only 1.3, allowing for better light catching by the photonic crystal structures. In some embodiments, photonic crystal structures 112 have a width 114 of about 1.2 μm. In some embodiments, photonic crystal structures 112 have a depth 116 of about 1 μm to about 1.5 μm. In some embodiments, photonic crystal structures 112 have a depth 116 of about 1.4 μm.

Photonic crystal structures 112 include a sidewall 118. In some embodiments, photonic crystal structures 112 include multiple sidewalls 118. Because of the increased vertical depth of photonic crystal structures 112, sidewall 118 is typically relatively steep, which allows for better light catching. In some embodiments, photonic crystal structures 112 have a sidewall angle 120 greater than about 55 degrees. In some embodiments, photonic crystal structures 112 have a sidewall angle 120 greater than about 70 degrees.

Figure 1B:
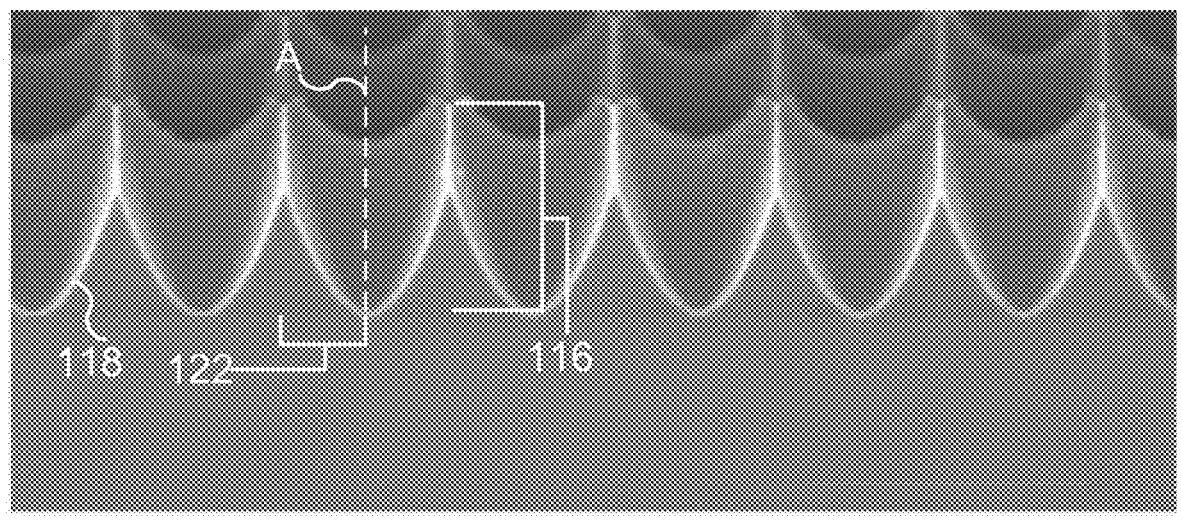
FIG. 1B is an enlarged front isometric scanning electron microscope image of a photonic crystal structure on the high absorption photovoltaic material according to some embodiments of the present disclosure.

Referring now to FIG. 1B, sidewall 118 is approximately Gaussian-shaped. The expression for the Gaussian shape is shown in Equation 2 below. As used herein, the term "approximately Gaussian-shaped" is used to convey that sidewall 118 do not need to rigorously adhere to the definition portrayed in Equation 2. Rather, sidewall 118 generally follows Equation 2 and if they do deviate, they do so insubstantially enough so as not to remove the advantageous refractive properties of sidewall 118. Equation 2 is defined as:

$$(x) = n_{min} + (n_{max} - n_{min})e^{-\left(\frac{x-1}{b}\right)^2} \quad (2)$$

where $n_{min}$ and $n_{max}$ are the minimum and maximum refractive index, respectively, x is the optical distance, and $b=0.52\pm0.2$, which represents the shape width of the profile.

The approximately Gaussian-shaped sidewall 118 is curved towards a central axis A. Sidewall 118 also increases in a thickness 122 as depth 116 of photonic crystal structures 112 increases. In some embodiments, thickness 122 of sidewall 118 increases continuously and smoothly.

Figure 1C:
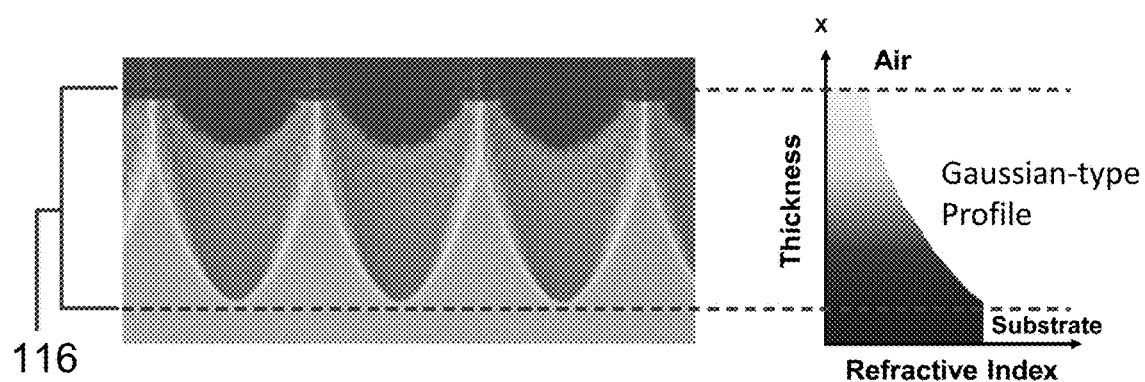
FIG. 1C is a schematic representation of a refractive index profile of the high absorption photovoltaic material according to some embodiments of the present disclosure.

Photovoltaic material 100 having photonic crystal structures 112 and specifically the shape and size of sidewall 118 provide light absorptive (anti-reflection) properties to photonic crystal structure layer 108 and thus to photovoltaic material surface 102 and photovoltaic material 100. Referring now to FIG. 1C, sidewall 118 has a gradient refractive index profile, where the refractive index increases with depth 116, which is known to be advantageously anti-reflective. In some embodiments, a gradient refractive index profile for sidewall 118 is substantially continuous. Photovoltaic material 100 having photonic crystal structures 112 and specifically the shape and size of sidewall 118 also exhibit parallel-to-interface refraction, or another mechanism that exhibits nearly parallel-to-interface light bending phenomena, the effect of which is a positive or negative refraction of light inside the photonic crystal structure. As a result, light interacting with photonic crystal structures 112 may be bent nearly perpendicularly. The optical path length of the light thus increases and vortex-like concentration of light at "hot spots" within photovoltaic material 100 occurs.

Figure 2:
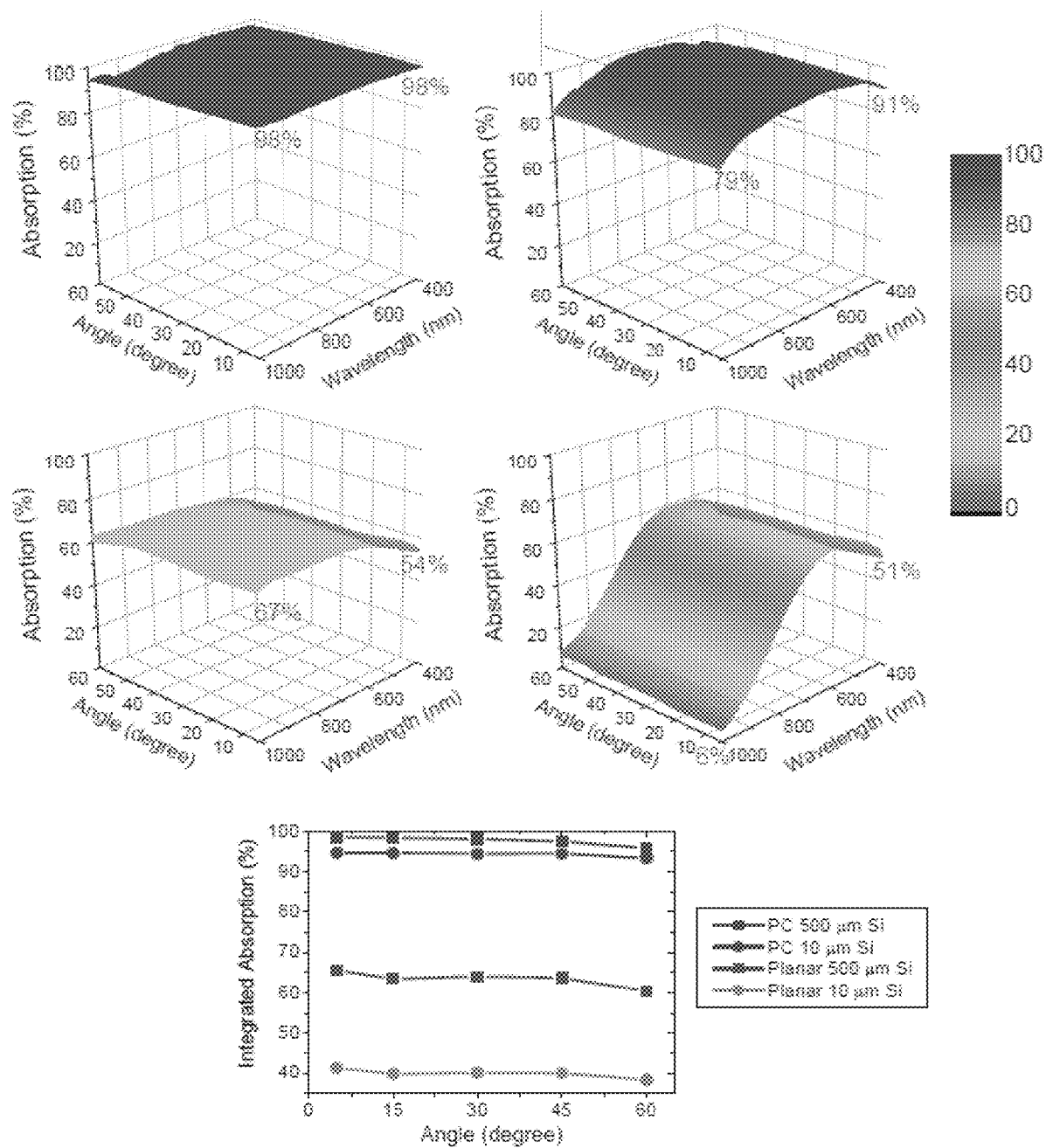
FIG. 2 is a series of charts of light absorption data exhibiting the improved absorbance properties of the high absorption photovoltaic material according to some embodiments of the present disclosure.

Referring now to FIG. 2, the practical results of this light bending and trapping by photonic crystal structures 112 and photovoltaic material 100 are greatly increased absorption of light, particularly at high wavelengths such in the near-infrared spectrum, as well as over a broader range of incidence angles. Compared to a similar thickness planar photovoltaic material, i.e., without photonic crystal structures 112, photovoltaic material 100 enhances absorption by as much as about 2.3, about 4.5, and about 13 times at λ=800, 900, and 1000 respectively. Overall, photovoltaic material 100 maintains an average absorption percentage from λ=400-1000 nm of up to about 98.5%, with no noticeable decrease in absorption percentage at higher incidence angles. Additionally, photonic crystal structures 112 have shown to limit the dependence of light absorbance on thickness of material. Thin 10 μm planar photovoltaic material was shown to have inferior absorbance compared to thicker 500 μm planar photovoltaic material. As shown in FIG. 2, photovoltaic material 100, i.e., with photonic crystal structures 112, having a thickness 106 of 10 μm showed vastly improved performance over a wide range of wavelengths compared to the 500 μm planar photovoltaic material, but also showed comparable performance to photovoltaic material 100 having a thickness 106 of 500 μm. For example, photovoltaic material 100 having a thickness 106 of 500 μm maintained an average absorption percentage from λ=400-1000 nm of up to about 98.5%; while photovoltaic material 100 having a thickness 106 of 10 μm still maintained an average absorption percentage from λ=400-1000 nm of up to about 94.7%.

Figure 3:
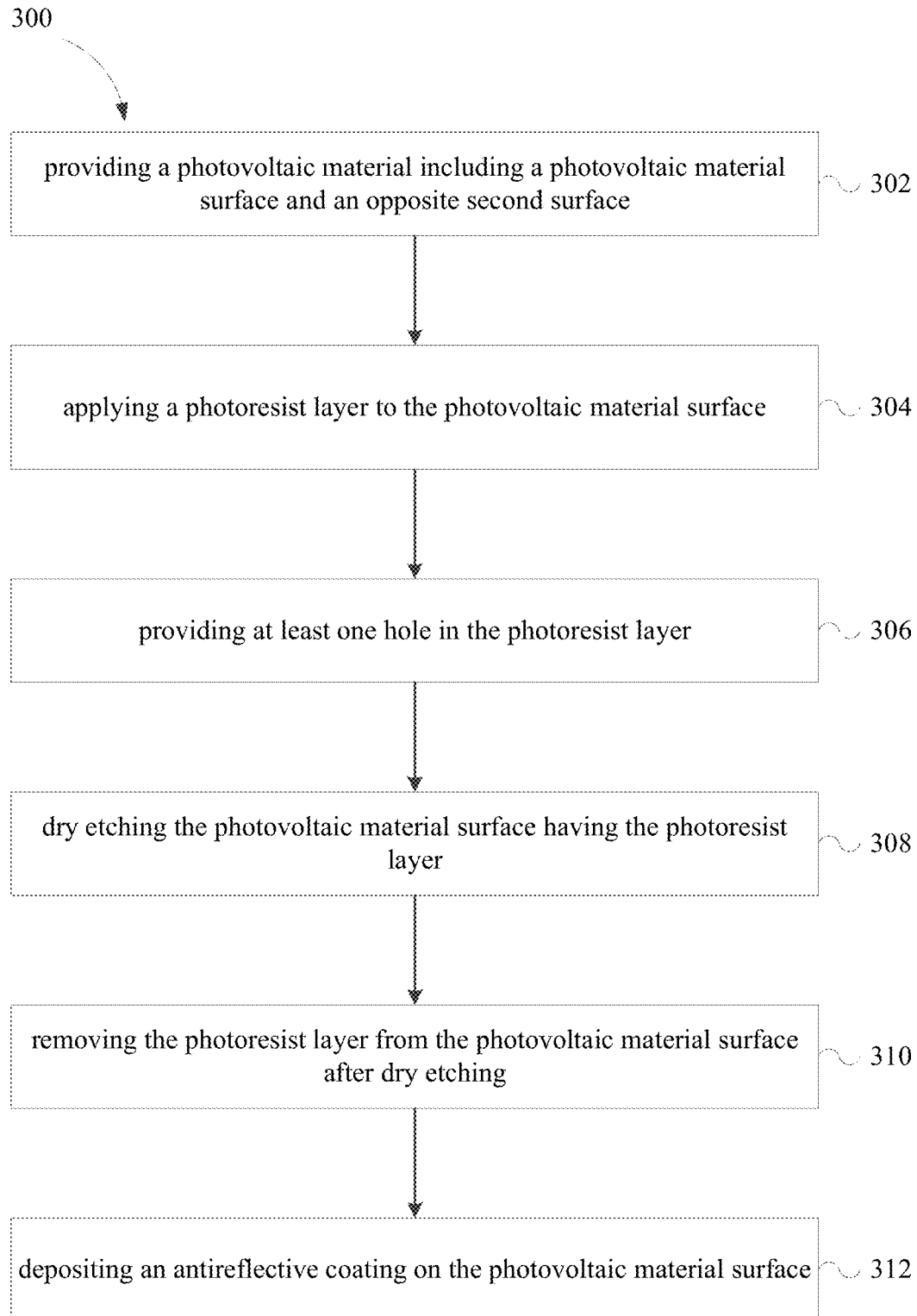
FIG. 3 is a chart of a method of making a high absorption photovoltaic material according to some embodiments of the present disclosure.

Referring now to FIG. 3, some embodiments of the disclosed subject matter include a method 300 of making a high absorption photovoltaic material. At 302, a photovoltaic material is provided including a photovoltaic material surface and an opposite second surface. At 304, a photoresist layer is applied to the photovoltaic material surface. In some embodiments, photoresist layer is applied 304 using a suitable photolithography process. At 306, at least one hole is provided in the photoresist layer. In some embodiments, the at least one hole is provided 306 after the photoresist is applied 304. In some embodiments, the at least one hole is provided 306 as the photoresist is being applied 304. In some embodiments, the at least one hole is an array of holes. In some embodiments, the array of holes is a uniform array. In some embodiments, the array of holes has simple cubic geometry. In some embodiments, the holes are spaced apart between about 1 μm and about 1.5 μm.

At 308, the photovoltaic material surface having the photoresist layer is dry etched. In some embodiments, dry etching 308 is a reactive-ion etching process. The holes discussed above extend through the photoresist layer to expose the photovoltaic material surface beneath and define where photonic crystal structures 112 are etched. In some embodiments, the photovoltaic material surface is dry etched at a predetermined wattage. In some embodiments, the predetermined wattage is relatively low for limiting etching damage and surface roughness at sidewall 118. In some embodiments, the predetermined wattage is about 100 watts. In some embodiments, the predetermined wattage is below 100 watts. In some embodiments, predetermined wattage is below about 50 watts.

In some embodiments, the photovoltaic material surface is dry etched using a gas mixture including an etchant component and a passivation component. The gas mixture has a high ratio of the etchant component to the passivation component. In some embodiments, the gas mixture ratio is greater than about 2 to 1 etchant component to passivation component. In some embodiments, the gas mixture ratio is at least about 3 to 1 etchant component to passivation component. In some embodiments, the gas mixture ratio is greater than about 3 to 1 etchant component to passivation component.

In some embodiments, the etchant component and the passivation component each include a halogen atom. In some embodiments, the etchant component and the passivation component each include a fluorine or a chlorine. In some embodiments, the etchant component and the passivation component are $SF_6$ and $CHF_3$ or $Cl_2$ and $BCl_3$.

As discussed above, the arrangement of the photonic crystal structures etched into the photovoltaic surface follows the arrangement of the holes in the photoresist layer. Because of the high ratio of etchant component to passivation, dry etching 308 is more isotropic, etching in horizontal as well as vertical directions. However, the undesired roughness one might expect from the high etchant component ratio is mitigated by the presence of the passivation component. The passivation component creates a passivation layer at the surface during etching, which slows the etching down and also limits isotropic undercutting.

In some embodiments, at 310, the photoresist layer is removed from the photovoltaic material surface after dry etching. In some embodiments, at 312, an anti-reflective coating is deposited on the photovoltaic material surface. In some embodiments, an oxidation process is used to deposit the anti-reflective coating. In some embodiments, an annealing process is used with the oxidation process to deposit the anti-reflective coating. In some embodiments, a chemical vapor deposition process is used to deposit the anti-reflective coating, e.g., plasma-enhanced chemical vapor deposition. In some embodiments, an atomic layer deposition process is used to deposit the anti-reflective coating.

The photovoltaic materials of the present disclosure include a photonic crystal structure layer that increases absorption versus a planar photovoltaic material, particularly at higher wavelengths. Because of this photonic crystal structure layer, more light is therefore available within the photovoltaic material when incorporated into a solar cell, and the solar cell can operate at a higher efficiency, i.e., produce more energy per unit time. The photovoltaic materials can also be produced using significantly less material, on the order of 50 times less, without sacrificing performance. The material cost for each solar cell thus decreases, allowing for the production of more solar cells that in turn results in the production of more energy.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention.

What is claimed is:

1. A high absorption photovoltaic material comprising:
   a photovoltaic material including a photovoltaic material surface and an opposite second surface; and
   a photonic crystal structure layer at said photovoltaic material surface, said photonic crystal layer including photonic crystal structures having an approximately inverse conical shape including an approximately Gaussian-shaped side wall having a gradient refractive index profile;
   wherein said photonic crystal structures have a substantially simple cubic symmetry,
   wherein the approximately Gaussian-shaped side wall has a shape defined as:

$$(x) = n_{min} + (n_{max} - n_{min})e^{-\left(\frac{x-1}{b}\right)^2}.$$

2. The material according to claim 1, wherein said gradient refractive index profile is substantially continuous.

3. The material according to claim 1, wherein said photonic crystal structures have a width (a) and a depth (d), wherein a value of d/(a/2) for said photonic crystal structures is greater than 2.

4. The material according to claim 3, wherein said photonic crystal structures have a width of about 1.2 μm and a depth of about 1.4 μm.

5. The material according to claim 1, wherein said photonic crystal structures have a sidewall angle greater than about 55 degrees.

6. The material according to claim 1, further comprising an anti-reflective coating on said photonic crystal structure layer.

7. The material according to claim 6, wherein said anti-reflective coating is SiO2, ZnO, AlO3, Si3N4, or a combination thereof.

8. The material according to claim 6, wherein said anti-reflective coating has a thickness less than about 0.1 μm.

9. The material according to claim 1, wherein said photovoltaic material includes a thin layer photovoltaic material having a thickness less than about 10 μm.

10. The material according to claim 1, wherein said photovoltaic material is composed of inorganic materials such as crystalline silicon, multi-crystalline silicon, amorphous silicon, GaAs, CIGS, CdTe, perovskite, organic photovoltaic materials, or a combination thereof.

11. A high absorption photovoltaic material comprising:
    a photovoltaic material including a photovoltaic material surface and an opposite second surface, said photovoltaic material having a thickness; and
    a photonic crystal structure layer at said photovoltaic material surface, said photonic crystal layer including photonic crystal structures having an approximately inverse conical shape including an approximately Gaussian-shaped side wall having a gradient refractive index profile, wherein said photonic crystal structures have a substantially simple cubic symmetry;
    wherein said photovoltaic material maintains an average absorption percentage from λ=400-1000 nm of up to about 98.5% when said thickness is about 500 μm, and said photovoltaic material maintains an average absorption percentage from λ=400-1000 nm of up to about 94.7% when said thickness is about 10 μm, wherein the approximately Gaussian-shaped side wall has a shape defined as:

$$f(x) = n_{min} + (n_{max} - n_{min})e^{-\left(\frac{x-1}{b}\right)^2}.$$

\* \* \* \* \*